United States Patent
Rombach

(10) Patent No.: US 11,272,296 B2
(45) Date of Patent: Mar. 8, 2022

(54) ROBUST DUAL MEMBRANE MICROPHONE

(71) Applicant: TDK Corporation, Tokyo (JP)

(72) Inventor: Pirmin Hermann Otto Rombach, Kongens Lyngby (DK)

(*) Notice: Subject to any disclaimer, the term of this patent is extended or adjusted under 35 U.S.C. 154(b) by 0 days.

(21) Appl. No.: 16/995,360

(22) Filed: Aug. 17, 2020

(65) Prior Publication Data

US 2021/0067882 A1 Mar. 4, 2021

(30) Foreign Application Priority Data

Aug. 28, 2019 (DE) .......... 102019123077.2

(51) Int. Cl.
*H04R 19/04* (2006.01)
*B81B 3/00* (2006.01)
*H04R 3/00* (2006.01)
*H04R 19/00* (2006.01)

(52) U.S. Cl.
CPC .......... *H04R 19/04* (2013.01); *B81B 3/0021* (2013.01); *H04R 3/005* (2013.01); *H04R 19/005* (2013.01); *B81B 2201/0257* (2013.01); *H04R 2201/003* (2013.01)

(58) Field of Classification Search
CPC ...... H04R 19/04; H04R 3/005; H04R 19/005; H04R 2201/003; H04R 2410/03; H04R 7/16; H04R 7/04; H04R 31/00; B81B 3/0021; B81B 2201/0257; B81C 1/00182
See application file for complete search history.

(56) References Cited

U.S. PATENT DOCUMENTS

| | | | |
|---|---|---|---|
| 8,664,733 B2 | 3/2014 | Rombach | |
| 9,181,080 B2 | 11/2015 | Dehe et al. | |
| 9,456,284 B2 * | 9/2016 | Morishita | H04R 19/04 |
| 9,828,237 B2 | 11/2017 | Walther et al. | |
| 10,045,126 B2 * | 8/2018 | Berger | H04R 7/24 |
| 10,589,990 B2 * | 3/2020 | Dehe | H04R 19/04 |
| 10,689,250 B2 | 6/2020 | Fueldner et al. | |
| 10,939,214 B2 * | 3/2021 | Kuntzman | H04R 7/18 |

(Continued)

FOREIGN PATENT DOCUMENTS

| | | |
|---|---|---|
| DE | 102009000053 A1 | 7/2010 |
| DE | 102014212340 A1 | 1/2015 |
| DE | 102017212613 A1 | 1/2019 |

OTHER PUBLICATIONS

Jesper Bay, et al., "Design of a Silicon Microphone with Differential Read-Out of a Sealed Double Parallel-Plate Capacitor," Sensors and Actuators A 53, Jun. 1996, 6 pages.

*Primary Examiner* — Oyesola C Ojo
(74) *Attorney, Agent, or Firm* — Slater Matsil, LLP

(57) ABSTRACT

A dual membrane microphone is disclosed. In an embodiment, a MEMS microphone includes a first membrane, a backplate with a separated central area including a first backplate electrode on a lower portion of the backplate, a second backplate electrode on a upper portion of the backplate and a backplate insulation layer galvanically isolating the first and the second backplate electrodes, a second membrane and a coupling central portion, wherein the first membrane couples mechanically to the separated central area of the backplate in an electrically isolating manner and the separated central area of the backplate couples to the second membrane in an electrically isolating manner.

17 Claims, 9 Drawing Sheets

(56) References Cited

U.S. PATENT DOCUMENTS

| | | | |
|---|---|---|---|
| 2014/0299948 A1* | 10/2014 | Wang | B81B 7/0061 |
| | | | 257/416 |
| 2015/0189444 A1* | 7/2015 | Pan | H04R 19/04 |
| | | | 381/173 |
| 2016/0066099 A1* | 3/2016 | Dehe | H04R 7/08 |
| | | | 381/174 |
| 2017/0230757 A1 | 8/2017 | Kuntzman et al. | |
| 2018/0234774 A1* | 8/2018 | Walther | H04R 19/005 |
| 2019/0023562 A1* | 1/2019 | Fueldner | B81B 3/0021 |

* cited by examiner

ROBUST DUAL MEMBRANE MICROPHONE

CROSS-REFERENCE TO RELATED APPLICATIONS

This application claims priority to German Patent Application No. 102019123077.2, filed on Aug. 28, 2019, which application is hereby incorporated herein by reference.

TECHNICAL FIELD

The present invention relates to improved MEMS microphones and methods for the production of such microphones.

BACKGROUND

MEMS microphones typically have a capacitor formed by a fixed and rigid electrode embodied in a planar fashion, the so-called backplate, and a further electrode embodied in a planar fashion and arranged in parallel that is flexible and able to oscillate forming the membrane or diaphragm.

If acoustic pressure waves impinge the microphone the flexible membrane may oscillate relative to the backplate changing the capacitance over time. A bias voltage (Vb) applied to the backplate (or the membrane) facilitates measuring sound pressure induced deflections of the membrane as a capacitance change results in a voltage change and thereby is providing a useful signal for further processing.

As the quality of a signal output can be greatly improved by implementing differential signal readout, in more sophisticated MEMS microphones often an arrangement with two capacitive elements is used. Subtracting or adding the signals of both capacitive elements can enhance the signal-to-noise ratio (SNR) and reduce the total harmonic distortion (THD) even at high sound pressure (130 dB).

In U.S. Pat. No. 8,664,733 B2 a MEMS microphone with a dual backplate construction is disclosed. A flexible membrane is positioned in between two outer backplate electrodes. The differential signal readout of the two capacitances improves the sensitivity of the microphone.

As the outer backplates inhibit the sensitivity, they often have large holes (5-20 μm) to decrease the acoustic resistance. Therefore, during production, packaging or usage particles might enter the air gap between membrane and backplate through the holes and restrict the movement of the membrane relative to the backplate.

U.S. Patent Application No. 2017/0230757 A1 discloses a MEMS microphone with a backplate positioned between two detached membranes allowing to generate a differential signal to enhance the sensitivity of the microphone. Due to a floating membrane construction the MEMS microphone has open gaps at the edge of the membranes allowing particles to get stuck or to enter the airgap. A particle in the airgap can hinder the displacement of the membrane, leading to a lower acoustic signal and causing a bad THD performance. Additionally, as the backplate has just one electrode for both capacitances, formed with the two membranes as the other electrodes, the bias voltages cannot be tuned independently.

U.S. Pat. No. 9,828,237 B2 discloses a MEMS device with a backplate possessing two adjacent electrode portions electrically isolated from each other and placed in between two coupled membranes while a low pressure region is formed in between the membranes. As the two membranes are hermetically sealing the airgap to sustain the low pressure region many pillars are necessary to couple the membranes with each other to maintain a constant distance of the membranes to the backplate, even at static pressure changes. The noise level in such an acoustically stiff system is high due to the low signal amplitude and the high correlation coefficient of the membranes, which annihilates the advantages of the differential signal readout.

SUMMARY

Embodiments provide a MEMS microphone with a differential signal readout which eliminates the drawbacks, e.g., particles in the airgap or an acoustic stiff system, as mentioned above.

Embodiments provide a MEMS microphone with two membranes that are spaced apart but are mutually coupled mechanically just in the center area of the membranes. In between these membranes a backplate comprising two electrically isolated electrodes on an upper and a lower surface respectively is positioned. When an acoustic pressure wave impinges the membranes a differential signal can be readout at four output ports that are coupled to the two membranes and the two backplate electrodes respectively.

As the membranes are mechanically coupled only in the center area of the membrane the construction does have, compared to known architectures of MEMS microphones with two membranes requiring a low pressure and hence many pillars in between the membranes, a smaller correlation coefficient for the two membranes. Therefore the noise level can be reduced and the SNR enhanced.

While a dual-backplate construction with a flexible membrane in between two backplates requires large holes in the backplates to reduce the acoustic resistance, embodiments with the dual-membrane construction can have just one hole, with a diameter smaller than 0.5 μm, in the first membrane facing the sound port, the second membrane, or both membranes. Alternatively, a multitude of holes smaller than 0.5 μm can be arranged one the first and second membrane. Thus, after production, as the holes are smaller than the typical particle size, no particles can enter the airgap between the membrane and the backplate. Consequently deterioration of sensitivity and THD performance due to particles in the airgap can be avoided and a higher durability and a longer lifetime achieved.

Further embodiments provide two electrically separated backplate electrodes each facing towards a respective one of the membranes. This allows adjusting the bias voltage for both capacitive elements completely independently. Hence, production tolerances regarding the airgap or tension variations in the membranes can be compensated by adapting the two bias voltages resulting in a better THD performance.

BRIEF DESCRIPTION OF THE DRAWINGS

In the following the invention and a method of manufacture is described based on embodiments with reference to the figures. Same parts or parts with equivalent effect are referred to by the same reference numbers.

The figures serve solely to illustrate the invention and are therefore only schematic and not drawn to scale. Some parts may be exaggerated or distorted in the dimensions. Therefore, neither absolute nor relative dimensions can be taken from the figures. Identical or identically acting parts are provided with the same reference numerals.

DETAILED DESCRIPTION OF ILLUSTRATIVE EMBODIMENTS

Figure 1:
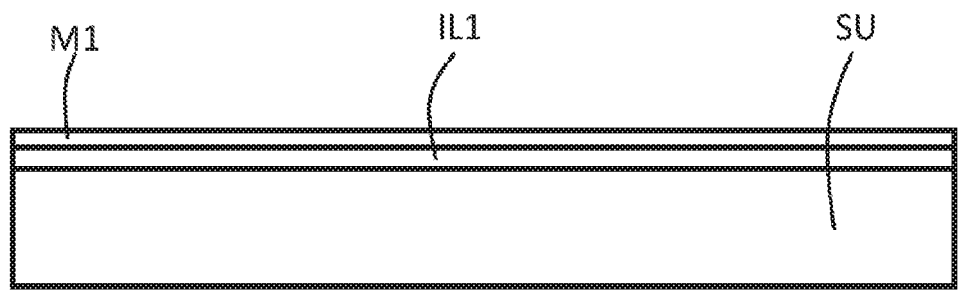
FIG. 1 shows a cross section through a substrate coated with a first partial layer construction.

One advantage of the described MEMS structure/MEMS microphone is that the production thereof can be done a simple method. Contrary to commonly used production methods, the new method differs in applying all partial layers of the layer construction sequentially one above another and patterning them from the top, i.e., that means only from one side. Just the substrate is etched from the other side after the layer construction has been produced thereupon to provide a freely oscillating region above the perforation in the substrate.

Sacrificial layers, preferably made out of silicon oxide, applied in the original layer construction between the functional layers, are etched from the top and bottom by wet etching at the same time. At least in the freely oscillating region the sacrificial layers are removed between the functional layers to excavate a free space creating the required distance between the functional layers.

The method comprises following steps:

a) On a substrate a first insulation layer IL1 and one or a plurality of partial layers for the first membrane M1 are deposited.

b) The partial layers of the first membrane M1 are patterned by lithographic etching.

c) Above the first membrane M1 a second insulation layer IL2 and a plurality of partial layers for the backplate BP are deposited while the two conductive partial layers as backplate electrodes (BPE1-2) are galvanically isolated from each other.

d) The partial layers of the backplate BP are patterned by lithographic etching, separating a central area SCA in the center of the backplate BP, which the horizontal radial extension of which is large compared to the vertical thickness of the second insulating layer IL2.

e) A third insulation layer IL3 and one or a plurality of partial layers for a second membrane M2 are deposited.

f) The second membrane M2 is patterned by lithographic etching.

g) A fourth insulation layer IL4 is deposited above the second membrane M2.

h) Openings OP1-4 to the electrically conductive partial layers of the first membrane M1, the two backplate electrodes BPE1-2 and the conductive partial layer of the second membrane M2 are etched and electrical contact pads CO1-4 are deposited therein.

i) A perforation PE is etched through the substrate SU from the bottom side of the substrate SU below an active region of the membranes to expose the layer stack formed in step a) below an active region of the membranes.

j) The insulation layers are removed in the active region by sacrificial etching (wet- or vapor-etch) creating an airgap between both membranes M1-2 and the backplate BP.

k) Sacrificial etching (wet- or vapor-etch) is stopped, sparing a portion of the insulation layers under and above the separated central area SCA in the center of the backplate BP etched in step d) to create two electrically isolating volumes coupling mechanically the separated central area SCA to both membranes M1-2 forming a rigid mechanical joint, the central coupling portion CCP.

All partial layers of the layer construction are first deposited to extend over the complete area of a respective underlying surface, which may be planarized. Wet etching or reactive ion etching (RIE) is then used for patterning the functional layers providing a good selectivity relative to the insulation layers underneath. Other anisotropically working etching methods are possible too.

The first insulation layer IL1 serves as an etch stop layer for the etching of the perforation into the silicon substrate from the surface opposing the layer stack. The insulation layers deposited between the functional layers serve as sacrificial layers that are removed later by wet etching in the active region above the perforation in the silicon substrate during method step j).

Protection of the second membrane M2 during etching of the openings to the conducting partial layers, the production of the contact pads in step h), etching of perforation in the silicon substrate in step j), as well as the removal of the sacrificial layers between the functional layers in step g) is provided by the fourth insulation layer IL4. A preferred material for all insulation and sacrificial layers is silicon oxide, which can be applied in an LPCVD method (low pressure chemical vapor deposition). In principle, however, other insulation layers and sacrificial layers are also suitable, particularly if they can be etched selectively.

Doped polysilicon is a suitable material to manufacture the electrically conductive partial layers of the functional layers. Therefore the polysilicon has to be doped which can be done with a p-type or n-type dopant, for example with boron or phosphorus. Nonetheless, other dopants are applicable for doping the polysilicon layer too as far as they can provide sufficient conductivity.

Silicon nitride layers are used as a mechanical structure and as electrical insulation in other partial layers of the functional layers. Both membranes preferably have a symmetrical structure which facilitate a linear deflection in both directions and increases the mechanical stability of the membranes. In a preferred embodiment both membranes therefore comprise three partial layers, each arranged in such a way that the mentioned above highly doped polysilicon layer has a silicon nitride layer adjacent to it on both sides respectively.

The backplate BP, located in between both membranes M1-2, on the other hand requires two backplate electrodes BPE1-2. In a simple embodiment the backplate BP consists of an insulating silicon nitride layer with two highly doped polysilicon layer applied on opposing surfaces thereof, each facing a corresponding membrane.

FIG. 1 shows in schematic cross section a substrate SU with a first partial layer construction comprising a first insulation layer IL1 and the first functional layer, the first membrane M1. Silicon providing sufficient stability in the case of a thickness of approximately 200-750 µm, serves as substrate, for instance. Thereabove, in a first LPCVD method, a first insulation layer IL1 is applied, for example a 1 µm thick $SiO_2$ layer deposited in a TEOS method. The first functional layer that is the first the membrane M1 is shown here as one layer, for the sake of simplicity, but may consist in a preferred embodiment of e.g. three partial layers, namely a highly doped polysilicon layer in between two silicon nitride layers. As a first and a third partial layer of the membrane M1, one or a plurality of silicon nitride layers is applied with a total layer thickness of about 0.1 µm, for example, in an LPCVD method.

The process is controlled such that the silicon nitride layer has a superstoichiometric content of silicon. One or a plurality of highly doped polysilicon layers, likewise applied using LPCVD deposition, serves as second partial layer of the first membrane M1. During application, the polysilicon layer is highly doped in situ with an n- or a p-type dopant (e.g. boron or phosphorus), that is to say provided with a B++ or P++ doping. FIG. 1 shows the arrangement at this method stage. The cross-sectional symmetrical construction of the membrane prevents the partial layers from being strained asymmetrically and the membrane from warping after being etched through on account of the strain.

Figure 2:
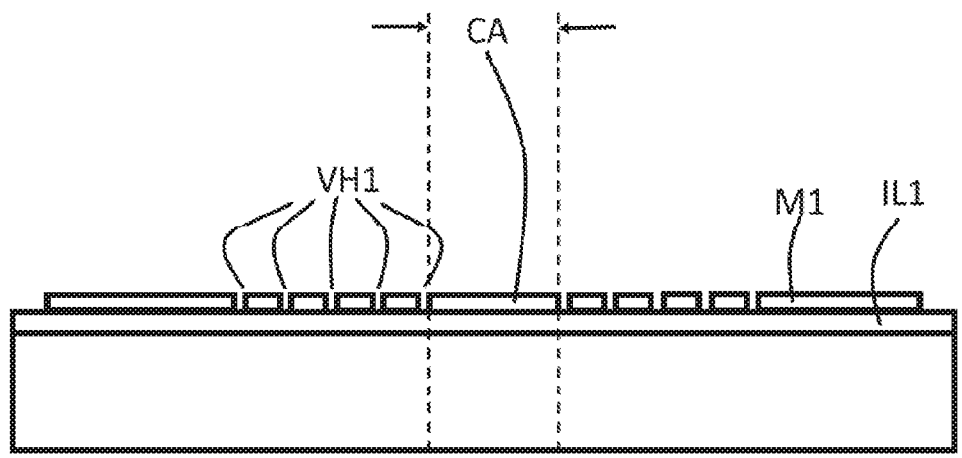
FIG. 2 shows a cross section through said construction with a patterned first functional layer thereon.

FIG. 2 shows the arrangement after the patterning of the first membrane M1. For the purpose of patterning, a photoresist is applied and developed, thereby exposing undesired regions of the layers forming membrane M1 which are then removed, respectively. In particular, the membrane is a really delimited and provided with optional small venting holes VH1, smaller than 0.5 µm in diameter, in the freely oscillating region. Said holes enable access for the etchant during later removal of the sacrificial layer. Due to the small size of the venting holes VH1 no particles larger than 0.5 µm can enter the microphone after production.

Noteworthy is the large non-patterned region in the central area CA of the membrane M1, which later becomes a part of the coupling central portion CPP during the manufacturing. The patterning of the membrane M1 is accomplished by means of an RIE etching process, for example.

Figure 3:
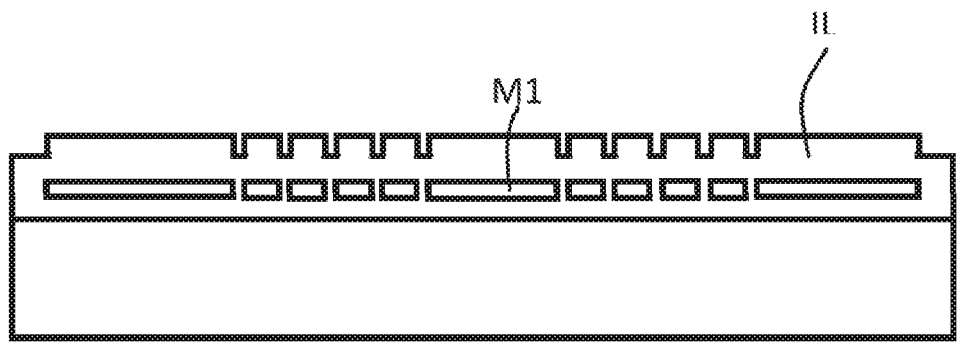
FIG. 3 shows the arrangement after edge-covering deposition of an insulation layer.

FIG. 3 shows the arrangement after the deposition of a further insulation layer IL. This is done once again in a TEOS LPCVD process. The layer thickness of said further insulation layer is dimensioned such that, firstly, the venting holes VH1 are completely overgrown with silicon oxide and, secondly, the total height of the insulation layer reaches at least the level of the top side of the membrane M1. The insulation layer IL and first insulation layer IL1 combine on account of identical material and deposition conditions to form a homogenous layer, which is depicted in the figure by virtue of the fact that no demarcation between first and further insulation layers is illustrated.

Figure 4:
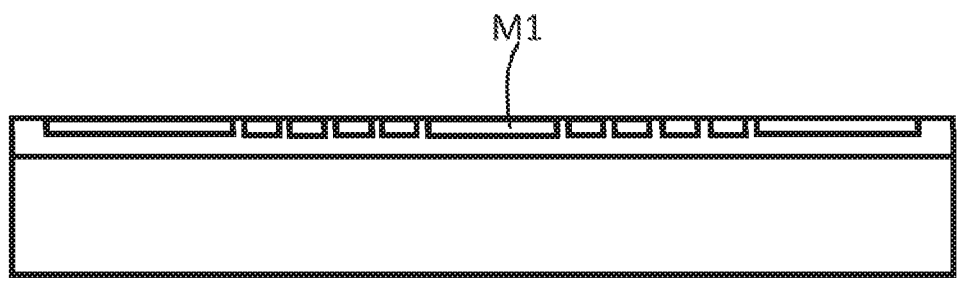
FIG. 4 shows the arrangement after planarization.

FIG. 4 shows the arrangement after a planarization process, in which the insulation layer is ground from the top down to the level of the upper edge of the membrane M1. By way of example, a CMP method can be used for this purpose.

Figure 5:
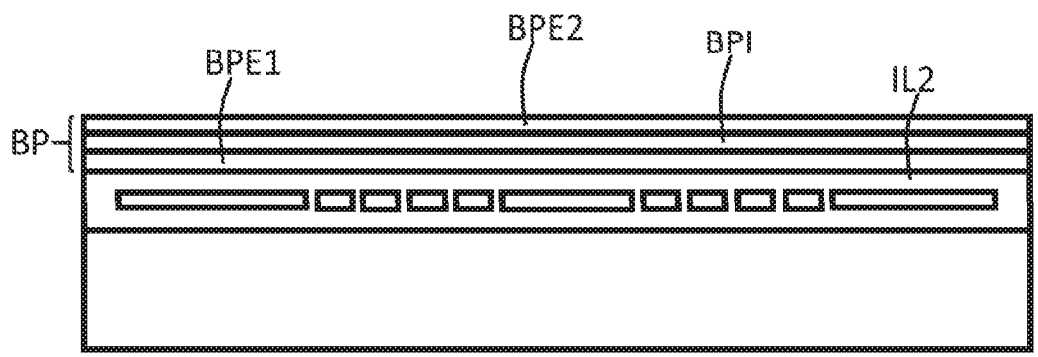
FIG. 5 shows the arrangement after the production of a second functional layer.

FIG. 5 shows the arrangement after the deposition of a second insulation layer IL2 and three partial layers for the backplate BP. The second insulation layer is again applied as a $SiO_2$ layer in a TEOS LPCVD method. For the backplate BP, firstly as a first partial layer the first backplate electrode BPE1 is applied as a highly doped polysilicon layer in an LPCVD method. Thereabove, as second partial layer the backplate isolation BPI, a non-conductive silicon nitride layer is applied, which can once again be deposited in an LPCVD method. The topmost and third partial layer, the second backplate electrode BPE2 of the backplate BP is once again a highly doped polysilicon layer, which is applied in a known manner. The polysilicon layers can be a separated structure to define the electrode areas.

Figure 6:
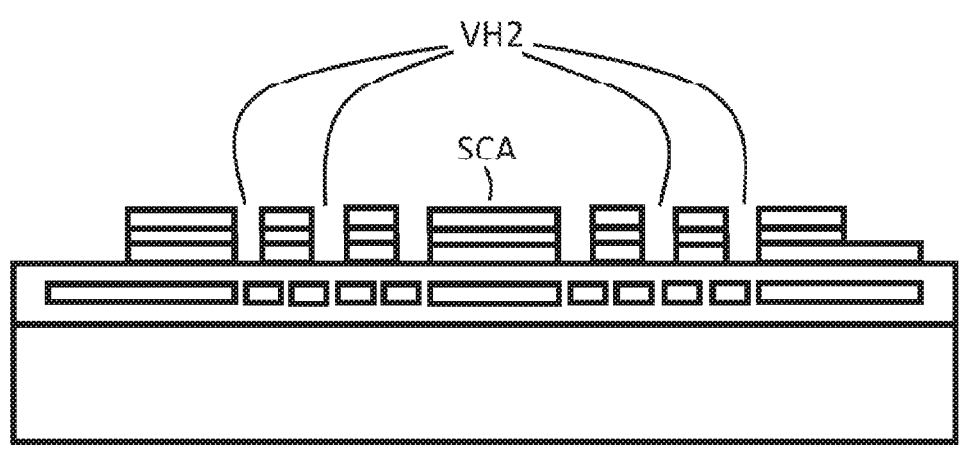
FIG. 6 shows the arrangement after patterning the second functional layer.

FIG. 6 shows a first cross section through the arrangement after the patterning of the backplate BP. For this purpose, a lithography step is carried out and the patterning is carried out in an RIE etching method designed for etching polysilicon and silicon nitride. If appropriate, the layers can be etched under different conditions by continuously changing the etching atmosphere. The backplate holes VH2 have a diameter of about 5-20 micrometer and are large compared to the small venting holes VH1 in the membrane, which are smaller than 0.5 µm, to reduce the acoustic resistance within the device. In the central area of the backplate BP an incision through all of the three partial layers surrounds and encloses a separated coupling area SCA, which is not attached to the rest of the backplate BP anymore. The separated coupling area SCA becomes a portion of the coupling between the membranes later on.

Figure 7:
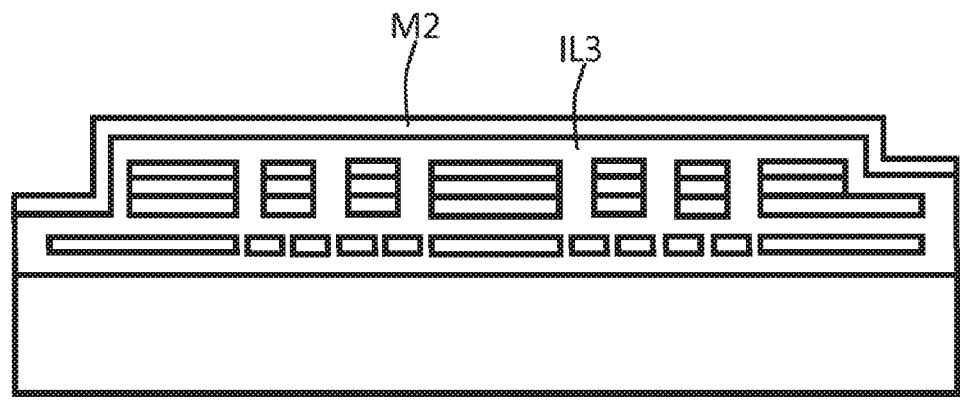
FIG. 7 shows the arrangement after the production of the third functional layer.

FIG. 7 shows the arrangement after the deposition of at least one further insulation layer and the second membrane M2. After planarization of this insulation layer, as described before for FIG. 4, a third insulation layer IL3 in the form of a $SiO_2$ layer is applied to the backplate BP in a TEOS LPCVD method. For the second membrane M2, which is shown in FIG. 7 for the sake of simplicity as one single layer, another three partial layers, namely a highly doped polysilicon layer in between two silicon nitride layers are applied to the third insulation layer IL3 using a conformal LPCVD method.

Figure 8:
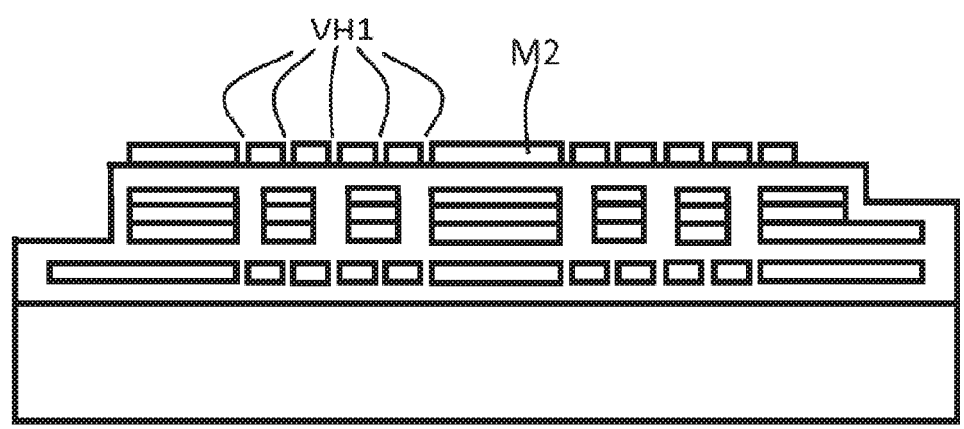
FIG. 8 shows the arrangement after patterning of the third functional layer.

FIG. 8 shows the arrangement after patterning of the layers forming the second membrane M2, respectively, which can once again be carried out in a manner supported lithographically by means of an RIE etching method. In this case, the third insulation layer IL3 serves as an etching stop layer. In the freely oscillating region, the second membrane M2 likewise provided with small venting holes VH1 that fulfill the same purpose, already mentioned, as the venting holes VH1 in the first membrane M1. In the next step, a fourth insulation layer IL4 is applied above the patterned second membrane M2 with a TEOS LPCVD method. This layer completely covers the patterned second membrane M2 including the holes and the patterned edges.

Afterward, various openings OP1-4 are etched into the insulation layers, at the bottom of which holes the conductive partial layers of first membrane M1, the second membrane M2 as well as both backplate electrodes BPE1-2 are respectively exposed. The removal of the $SiO_2$ layers in the openings is carried out by means of a wet etching step adjusted selectively to $SiO_2$. In this case, the polysilicon layer of the second membrane M2, both backplate electrodes BPE1-2, consisting of polysilicon and the polysilicon layer of the first membrane M1 function as an etching stop layer.

In order to uncover the polysilicon layer of the membranes and the first backplate electrode BPE1, the silicon nitride layer also has to be removed in the corresponding openings, which is carried out by means of an RIE etching method.

Figure 9:
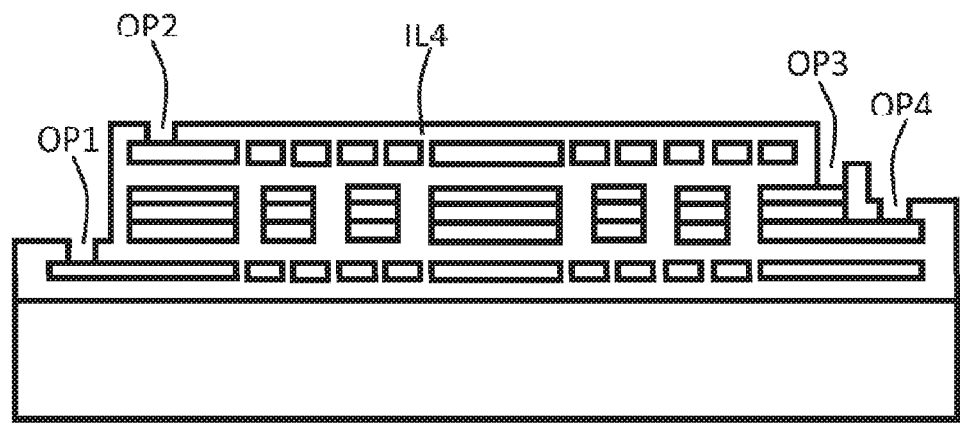
FIG. 9 shows the arrangement after the production of a further insulation layer and the opening of the contact holes.

FIG. 9 shows a first opening OP1, in which the polysilicon layer of the first membrane M1 is uncovered, a second opening OP2, in which the polysilicon layer of the second membrane M2 is uncovered, a third opening OP3, in which the polysilicon layer of the second backplate electrode BPE2 is uncovered and a forth opening OP4 uncovering the first backplate electrode BPE2. The illustration does not show possible further contact holes to one of the stated functional layers or to the substrate SU.

Figure 10:
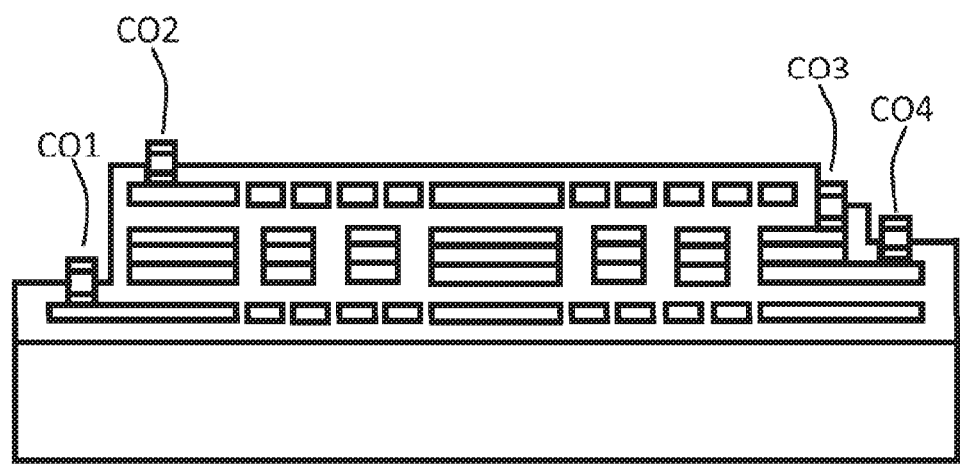
FIG. 10 shows the arrangement after production of contact holes and contacts therein.

After the next step, shown in FIG. 10, contact pads CO1-4 are produced in the opening OP1-4. These are produced in a method, wherein a base metallization, a conductive layer and a covering layer are produced one above another. The base layer is deposited over the whole area and patterned. The conductive layer and the covering layer can be grown selectively above the patterned base metallization. Suitable layers are, for example, 1 μm aluminum for the base metallization, 3 μm nickel for the conductive layer and 300 nm Au for the covering layer. Likewise solely an Al layer can be used for forming contact pads CO1-4.

Figure 11:
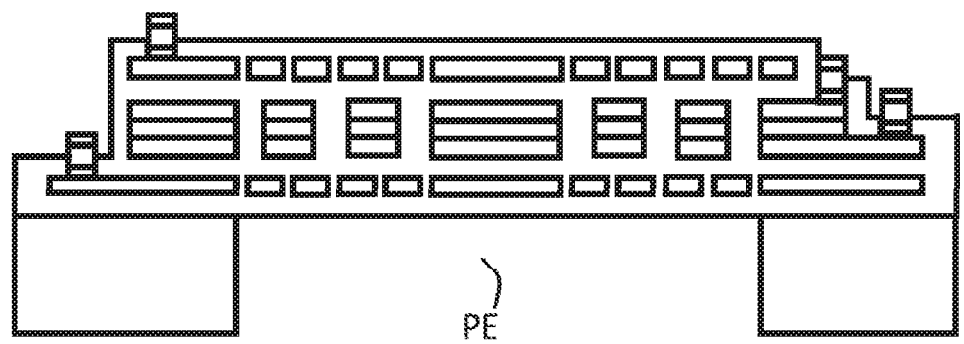
FIG. 11 shows the arrangement after the production of a perforation through the silicon substrate.

FIG. 11 shows a schematic cross section of the layer stack after a perforation PE has been etched anisotropically through the substrate SU by means of a DRIE method. Despite the area provided for the perforation (PE) being on the underside of the substrate SU, all other surfaces are covered with a protective layer, in particular with the resist used for the lithography. In the DRIE method, the first insulation layer IL1 directly on the substrate serves as an etching stop layer.

The next step then involves removing those regions of the insulation layers which serve as sacrificial layers, in particular in the freely oscillating region between the first membrane M1, the backplate BP and the second membrane M2, and also the remaining insulation layer IL4 applied superficially. An isotropic etching process is used to remove most of the sacrificial layers between both membranes M1-2 and the backplate BP. Well suited for example, a VHF (HF vapor etch) process, which operates with vaporous or gaseous hydrogen fluoride or hydrofluoric acid. This etching process is not quite selective against polysilicon and silicon nitride, so that respective partial layers of the functional layers are only slightly affected. The removal of the sacrificial layers is done only in the active region, so that the membranes are fixed at the edge by the whole layer composite.

Due to the geometry of the layer construction, in particular because the horizontal extension of the separated coupling area SCA of the backplate BP is large compared to the vertical distance between the backplate BP and one of the membranes M1-2, the sacrificial layer is not removed completely between the membranes M1-2 in the separated coupling area SCA, but just only at the edges of the separated coupling area SCA. The remaining portions of the sacrificial layers in between separated coupling area SCA the backplate BP and the membranes M1-2 serve as a coupling element between the membranes M1-2 and the separated coupling area SCA and form together central coupling portion CCP coupling both membranes to each other.

In a final step, reactive surfaces can be passivated and are saturated with unreactive groups. For doing this, a so-called SAM layer (=self assembling monolayer), for example can be applied. In this case molecules containing elongated radicals are bonded to the reactive surfaces of the microphone by means of a reactive group and form a monolayer, that is, a monomolecular film of the thickness of a molecular length. The other end of the elongated radical is chemically inert and preferably also has little physical interaction with other materials. If the inert residue is, for example, a fluorinated alkyl group, then the radicals set up in the monolayer with the inert ends parallel to each other and extend normal to the surface. Thereby the surface is passivated, cannot oxidize, corrode, is water and dust resistant, and thereby prevents the membrane M1 to adhere to the backplate BP.

Figure 12:
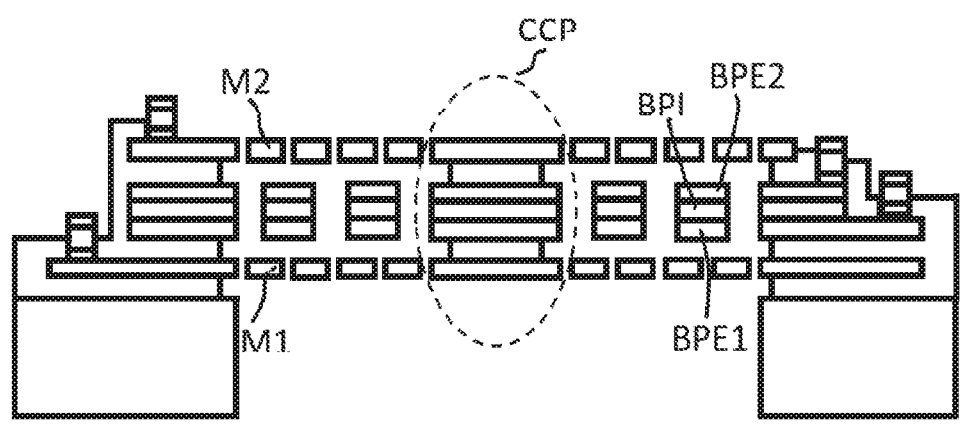
FIG. 12 shows the finished microphone after the removing the sacrificial layers in the active region.

FIG. 12 shows a first cross section through the structure obtained after passivation, in which stage the microphone has largely been completed.

Figure 13:
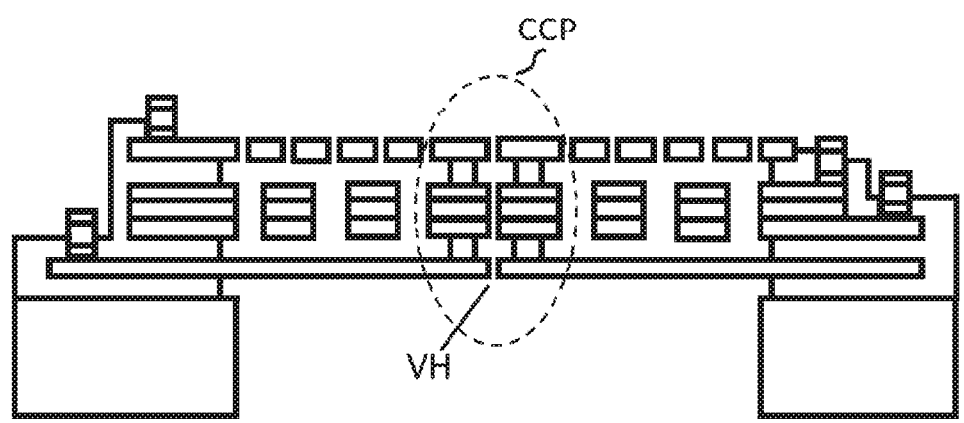
FIG. 13 shows a finished microphone in accordance with a second embodiment.

FIG. 13 shows a second embodiment of the MEMS microphone.

In this embodiment most of the vent holes VH1 in the first membrane M1 are omitted. Instead, one central vent hole VH1 is produced in the first membrane M1, in the separated central area SCA and an additional vent hole in the center of the second membrane M2. By omitting most of the vent holes the microphone is even more robust as no particles can enter the airgaps between the membrane M1 and backplate BP pointing towards the sound port.

Schematic top views onto some selected layers of this embodiment are shown in FIG. 16. FIG. 16a shows the first membrane M1. It has just one venting holes VH1 in the center of the membrane. This venting hole VH causes an undercut in the underlying remaining portion of the sacrificial layer, a coupling, between the membranes M1-2 and the backplate BP after the VHF etching process resulting in a gap in the central coupling portion CCP that is larger than the according vent hole VH in the membrane as shown in FIG. 16b.

Figure 16E:
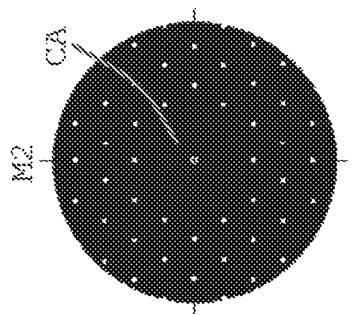
FIGS. 16a-e show a schematic planar cross section of a) a first membrane; b) a coupling element between a first membrane and the backplate; c) the backplate; d) a coupling element between the backplate and a second membrane; e) a second membrane of the second embodiment shown in FIG. 13.
Figure 16D:
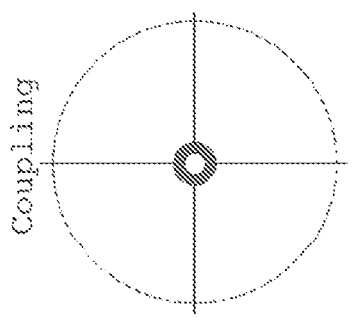
Figure 16C:
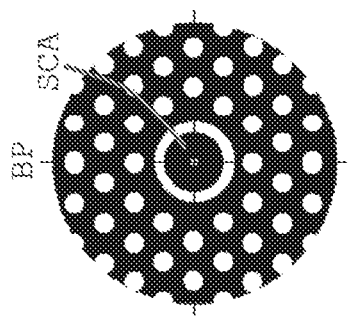
Figure 16B:
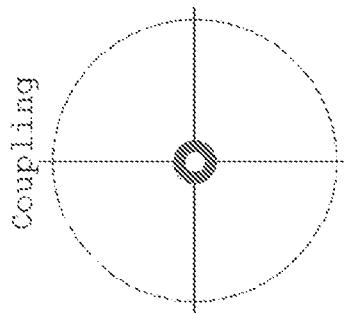
Figure 16A:
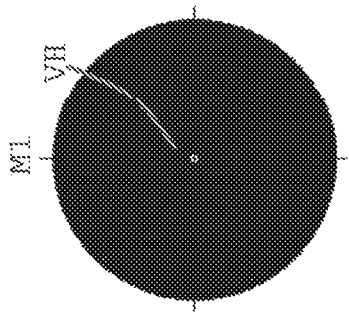

The backplate, as shown in FIG. 16c also has a small central venting hole VH in the separated central area SCA. The separated central area SCA has no connection to the rest of the backplate BP and can move independently from the rest of the backplate BP. Another remaining portion of the sacrificial layer, which is shown in FIG. 16d, couples the separated central area SCA to the second membrane M2. The second membrane M2 has, additional to the central venting hole VH piercing the complete microphone, a plurality of venting holes VH arranged over the area outside of the central area CA, as can be seen in FIG. 16e.

Figure 14:
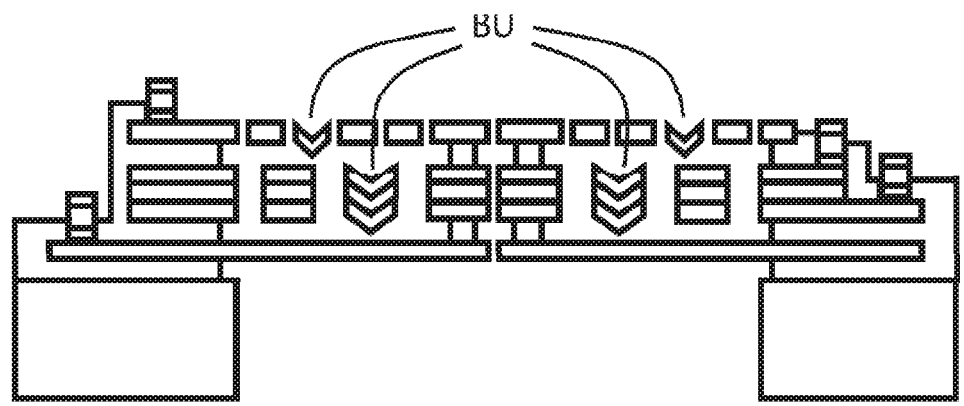
FIG. 14 shows a finished microphone in accordance with a third embodiment.

In FIG. 14 a schematic cross section of another embodiment of the MEMS microphone is shown. It differs from the embodiment shown in FIG. 13 by employing bulges BU in the second membrane M2 and the backplate BP that work as respective stoppers reducing the maximum possible membrane displacement. These bulges BU are manufactured in the layers by firstly producing depressions in the insulation layer IL2-3 directly below the layer having the desired bulges BU by means of lithography and an RIE etching method. In the next step the partial layers of the functional layer are deposited as usual. As the partial layers are close fitting to the topography of the depressions of the insulation layer below, bulges BU are formed this way.

Figure 15:
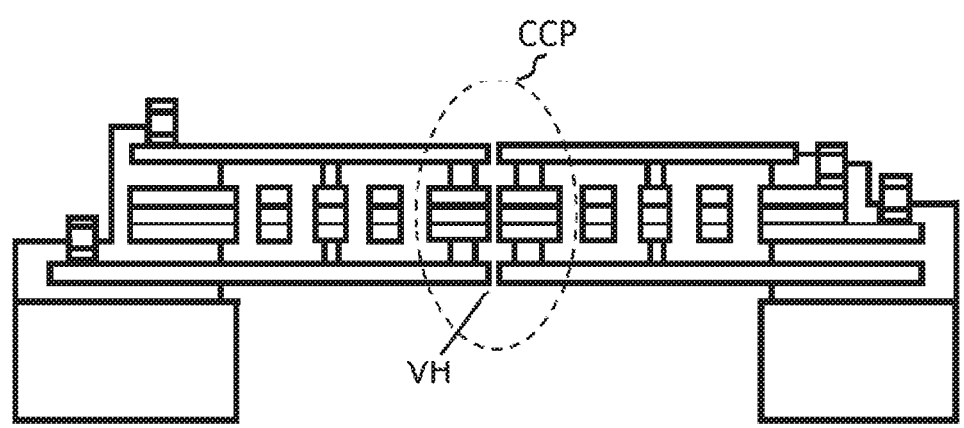
FIG. 15 shows a finished microphone in accordance with a fifth embodiment.

FIG. 15 shows a schematic cross section of a further embodiment of the MEMS microphone. In this embodiment all the small vent holes VH1, with the exception of the central vent hole VH, are omitted in the second membrane M2 compared to the embodiment shown in FIG. 13. Therefore, the space between the first and second membranes M1, M2 is now sealed and allows to be evacuated or set under negative pressure. As a consequence, the noise measured by the backplate BP is reduced even further. To mechanically withstand an applied or produced vacuum, it is necessary to stabilize the membranes M1, M2. Else the membranes M1, M2 could collapse. To prevent collapsing, coupling portions are introduced along the membranes M1, M2, which stabilize the membranes M1, M2. The coupling portions support the membranes M1, M2 by coupling them to the stiff backplate BP. As in the central coupling portion CCP, the coupling portions are remaining portion of the sacrificial layers. Alternatively, it is also possible to implement bulges BU, similar to FIG. 14, to stabilize the membranes M1, M2 and keep them spaced apart from the backplate BP.

It has to be noticed that the invention is not limited to the layouts described before and that further layouts can be retrieved by combination of features taken from different figures and embodiments.

What is claimed is:

1. A MEMS microphone comprising:
   a first membrane;
   a backplate with a separated central area comprising:
      a first backplate electrode on a lower portion of the backplate;
      a second backplate electrode on a upper portion of the backplate; and
      a backplate insulation layer galvanically isolating the first and second backplate electrodes;
   a second membrane; and
   a coupling central portion,
   wherein the first membrane couples mechanically to the separated central area of the backplate in an electrically isolating manner and the separated central area of the backplate couples to the second membrane in an electrically isolating manner, and
   wherein the first membrane and/or the second membrane comprise(s) a single vent hole with a diameter smaller than 0.5 µm.

2. The microphone according to claim 1, wherein the vent hole goes through all layers in the coupling central area.

3. The microphone according to claim 1, wherein the second membrane has bulges configured to constrain a displacement of the second membrane relative to the backplate.

4. The microphone according to claim 1, wherein the backplate has bulges configured to constrain a displacement of the first membrane relative to the backplate.

5. A method for manufacturing a MEMS microphone, the method comprising:
   a) on a substrate the following layers are deposited one above another: a first insulation layer and one or a plurality of partial layers for a first membrane;
   b) the partial layers of the first membrane are patterned by lithographic etching;
   c) above the first membrane the following layers are deposited:
      a second insulation layer and a plurality of partial layers for a backplate comprising two conductive partial layers as backplate electrodes that are galvanically isolated from each other;
   d) the partial layers of the backplate are patterned by lithographic etching, separating a central area in a center of the backplate, a horizontal radial extension of which is large compared to a vertical thickness of the second insulation layer;
   e) a third insulation layer and one or a plurality of partial layers for a second membrane are deposited;
   f) the second membrane is patterned by lithographic etching;
   g) a fourth insulation layer is deposited above the second membrane;
   h) openings to the electrically conductive partial layers of the first membrane, the two backplate electrodes and the conductive partial layer of the second membrane are etched and electrical contact pads are deposited therein;
   i) a perforation is etched through the substrate from a bottom side of the substrate below an active region of the first membrane to expose the layer stack formed in step a) below the active region of the first membrane; and
   j) the insulation layers are removed in the active region by an isotropic wet etching creating an airgap between both membranes and the backplate, wherein the isotropic wet etching is controlled to prevent a portion of the insulation layers under and above the separated central area from being etched away, thereby creating two electrically isolating volumes coupling mechanically in the separated central area to both membranes and forming a rigid mechanical joint and a central coupling portion.

6. The method according to claim 5, wherein the partial layers and the insulation layers are deposited by LPCVD.

7. The method according to claim 5, wherein in method step a) or e) a $SiO_2$ layer is deposited as an insulation layer, thereabove as a first partial layer a silicon nitride layer, as a second partial layer a polysilicon layer and as a third partial layer a further silicon nitride layer is deposited to assemble the first or second membrane.

8. The method according to claim 5, wherein in method step c) a $SiO_2$ layer is deposited as the second insulation layer, thereabove as a first partial layer a polysilicon layer, as a second partial layer a silicon nitride layer and as a third partial layer a further polysilicon layer is deposited to form the backplate.

9. A method for manufacturing a MEMS microphone, the method comprising:
   depositing a first insulation layer for a first membrane on a substrate;
   depositing one or more partial layers for the first membrane on the first insulation layer;
   patterning the one or more partial layers of the first membrane by lithographic etching;
   depositing on the first membrane a second insulation layer;
   depositing on the second insulation layer a plurality of partial layers for a backplate comprising two conductive partial layers as backplate electrodes that are galvanically isolated from each other;
   patterning the partial layers of the backplate by lithographic etching;
   separating a central area in a center of the backplate, wherein a horizontal radial extension of the central area is large compared to a vertical thickness of the second insulation layer;
   deposing a third insulation layer and one or more partial layers for a second membrane;
   patterning the second membrane by lithographic etching;
   depositing a fourth insulation layer on the second membrane;
   etching openings to the electrically conductive partial layers of the first membrane, the two backplate electrodes and the conductive partial layer of the second membrane;
   depositing electrical contact pads in the openings;

etching a perforation through the substrate from a bottom side of the substrate below an active region of the first membrane to expose a layer stack formed by depositing the first insulation layer and depositing the one or more partial layers below the active region of the first membrane; and removing the insulation layers in the active region by an isotropic wet etching thereby creating an airgap between both membranes and the backplate, wherein the isotropic wet etching is controlled to prevent a portion of the insulation layers under and above the separated central area from being etched away, thereby creating two electrically isolating volumes coupling mechanically in the separated central area to both membranes and forming a rigid mechanical joint and a central coupling portion.

10. The method according to claim 9, wherein the partial layers and the insulation layers are deposited by LPCVD.

11. The method according to claim 9, wherein the second insulation layer is a $SiO_2$ layer, and wherein the plurality of partial layers for the backplate comprises a first partial layer being a polysilicon layer, a second partial layer being a silicon nitride layer and a third partial layer being a further polysilicon layer.

12. The method according to claim 9, wherein the first insulation layer is a $SiO_2$ layer, and wherein the one or more partial layers for the first membrane comprise a first partial layer being silicon nitride layer, a second partial layer being a polysilicon layer and a third partial layer being a further silicon nitride layer.

13. The method according to claim 9, wherein the third insulation layer is a $SiO_2$ layer, and wherein the one or more partial layers for the second membrane comprise a first partial layer being silicon nitride layer, a second partial layer being a polysilicon layer and a third partial layer being a further silicon nitride layer.

14. A MEMS microphone comprising:
a first membrane;
a backplate with a separated central area comprising:
a first backplate electrode on a lower portion of the backplate;
a second backplate electrode on a upper portion of the backplate; and
a backplate insulation layer galvanically isolating the first and second backplate electrodes;
a second membrane; and
a coupling central portion,
wherein the first membrane couples mechanically to the separated central area of the backplate in an electrically isolating manner and the separated central area of the backplate couples to the second membrane in an electrically isolating manner, and
wherein the first membrane and the second membrane are mutually coupled mechanically just in a center area of the membranes.

15. The microphone according to claim 14, further comprising at least one vent hole going through all layers in the coupling central area.

16. The microphone according to claim 14, wherein the second membrane has bulges configured to constrain a displacement of the second membrane relative to the backplate.

17. The microphone according to claim 14, wherein the backplate has bulges configured to constrain a displacement of the first membrane relative to the backplate.

* * * * *